United States Patent [19]

Rahilly

[11] 4,116,717

[45] Sep. 26, 1978

[54] ION IMPLANTED EUTECTIC GALLIUM ARSENIDE SOLAR CELL

[75] Inventor: William P. Rahilly, Dayton, Ohio

[73] Assignee: The United States of America as represented by the Secretary of the Air Force, Washington, D.C.

[21] Appl. No.: 748,584

[22] Filed: Dec. 8, 1976

[51] Int. Cl.$^2$ ............................................. H01L 31/06
[52] U.S. Cl. .................... 136/89 SJ; 29/572; 148/1.5; 357/30; 357/90; 357/91
[58] Field of Search .......... 136/89 CC, 89 SG, 89 SJ; 29/572; 357/30, 90, 91; 148/1.5

[56] References Cited

U.S. PATENT DOCUMENTS

| 3,675,026 | 7/1972 | Woodall | 250/211 J |
| 3,969,746 | 7/1976 | Kendall et al. | 357/30 |

OTHER PUBLICATIONS

R. K. Smeltzer et al. "Vertical Multijunction Solar Cell Fabrication," *Conf. Record*, 10$^{th}$ IEEE Photospecialists' Conf., Palo Alto, Calif., Nov. 1973, pp. 194–196.
K. V. Vaidyanathan et al., "The Effect of Be$^+$ Ion Implantation and Uniform Impurity Profiles on the Electrical Characteristics of GaAs Solar Cells," *Conf. Record*, 10$^{th}$ IEEE Photospecialists' Conf., Palo Alto, Calif., Nov. 1973, pp. 31–33.

*Primary Examiner*—John H. Mack
*Assistant Examiner*—Aaron Weisstuch
*Attorney, Agent, or Firm*—Joseph E. Rusz; Robert Kern Duncan

[57] ABSTRACT

An improved gallium arsenide solar cell is provided by ion implanting both the top and bottom of a plural vertical PN junction eutectic gallium arsenide cell body to obtain an electrical drift field, with multiple ion implants progressively larger in dose and progressively lower in implant energies to provide a P-type ion implanted top layer having a common connection to all P regions of the cell body and an N-type ion implanted bottom layer having a common connection to all N regions of the cell body. The implanted regions of the cell are pulsed electron beam annealed at room temperature.

3 Claims, 5 Drawing Figures

ION IMPLANTED EUTECTIC GALLIUM ARSENIDE SOLAR CELL

RIGHTS OF THE GOVERNMENT

The invention described herein may be manufactured and used by or for the Government of the United States for all governmental purposes without the payment of any royalty.

BACKGROUND OF THE INVENTION

The field of the invention is in the solar cell art. Gallium arsenide solar cells of various types have previously been fabricated. Generally, the prior art cells have been expensive to produce and have had a relatively high series resistance characteristic that has seriously limited their efficiency and performance. A P+ window has also previously been required over the top of the cell. Examples of the prior art relating to GaAs polar cells, vertical junction cells, and GaAs fabrication methods may readily be found in the following patents: U.S. Pat. Nos. 3,675,026 to patentee J. M. Woodall; 3,690,953 to patentee J. F. Wise, 3,969,746 to patentees D. L. Kendall et al; and 3,500,135 and 3,765,956 to patentee C. H. Li.

SUMMARY OF THE INVENTION

The use of multiple implant currents and energies to ion implant surfaces to connect the alternate P and N regions of the cell, and the anneal of the implanted regions using a pulsed electron beam to avoid the detrimental effects of prior art high temperature processing after wafer preparation, provides a novel combination of known technologies, here-to-fore unrelated, to achieve high performance solar cells for space and/or terrestrial use. The invention substantially solves the previous high series resistance problem of gallium arsenide cells present in the prior art. In addition to providing devices having higher conversion efficiencies than previously produced devices, the novel method and structure are substantially simpler and more economical to produce.

DESCRIPTION OF THE PREFERRED EMBODIMENT

Figure 1:
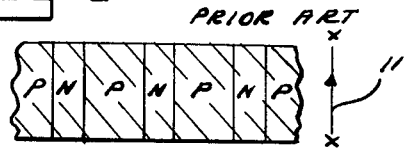
FIG. 1 is a schematic diagram of a section of a typical prior art gallium arsenide vertical junction P-N crystal wafer along the growth axis.
Figure 2:
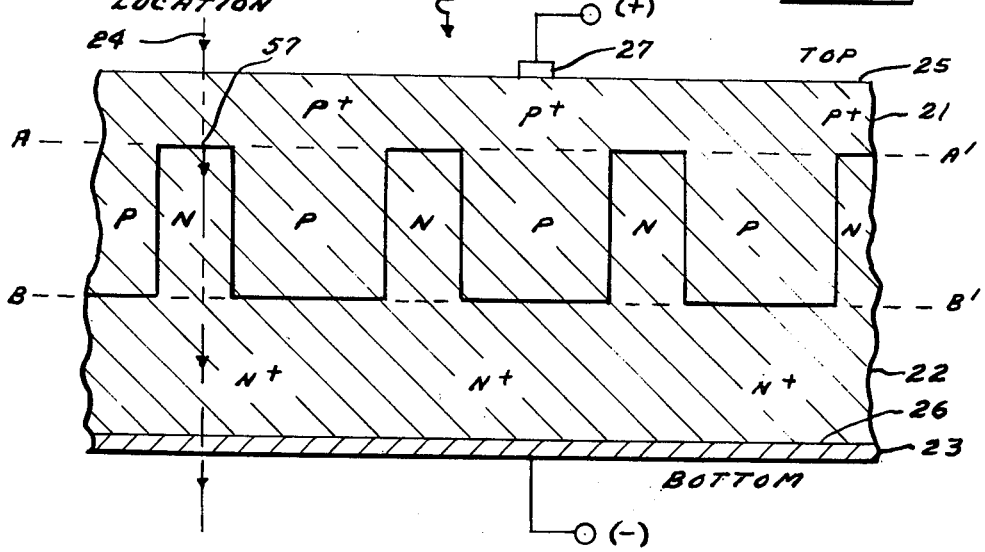
FIG. 2 is a schematic section view of an embodiment of the invention.

An embodiment of the invention (not to scale), as illustrated schematically in FIG. 2, is fabricated from a wafer of conventional PN gallium arsenide as schematically illustrated in FIG. 1. The wafer is fabricated in the conventional manner by growing the crystal in a boat from a conventional eutectic mix of gallium, arsenic and conventional PN dopants (such as zinc or beryllium, and silicon or tellurium, respectively), in conventional proportions to achieve the conventional segregation and obtain the PN junctions during crystal growth. In a conventional manner a wafer, as illustrated in FIG. 1, is cut from the crystal. Typical wafer thickness as measured along the growth axis 11 suitable for embodiments of the invention is approximately 250 microns.

Figure 4:
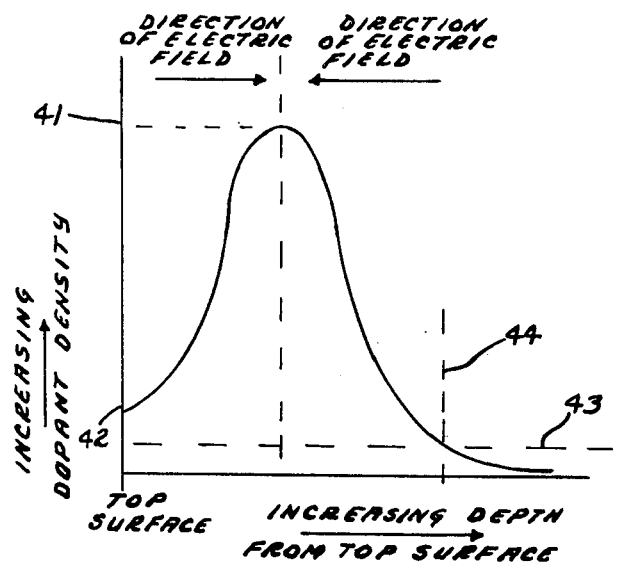
FIG. 4 is a graph showing the characteristics of single dose ion implantation.

A P+ layer 21 is created by implanting a conventional P impurity such as zinc or beryllium in the top of the crystal. Ion implantation of impurities to create heavily doped layers is known. FIG. 4 illustrates the resulting profile of a single dose and energy implant providing a peak level 41 of approximately $5 \times 10^{20}$ zinc atoms per cubic centimeter. The dopant level 42 at the top surface is approximately $10^{18}$. Line 43 represents the N dopant level in the wafer. Line 44 represents a P+N junction located approximately 0.2 micrometer in from the top surface as would occur along line A—A' of FIG. 2. Devices formed in this manner, while operable, are not as efficient as those described later because as can be seen in FIG. 4, the profile peaks below the surface and establishes a retrograde electric field (subsequent to implant anneal) that will promote electron migration to the surface which represents a loss of carriers that should preferably go across the P+N junction.

Figure 5:
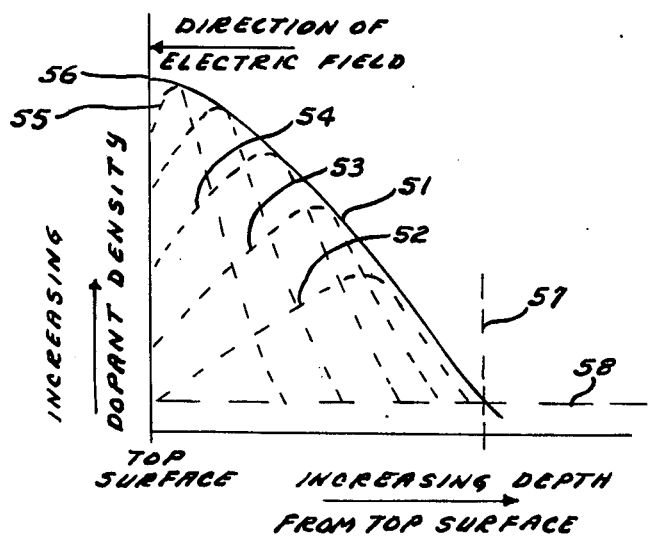
FIG. 5 is a graph illustrating a typical improvement in dopant distribution by multiple ion implantation dosages and implantation energies.

The novel process of using multiple implantation using increasing dose and decreasing energy results in the net P dopant profile 51 illustrated in FIG. 5. This profile is achieved by building up a series of profiles on top of profiles as illustrated by the dotted curves 52 through 55. The peak density 56 of dopant atoms is the same as previously, i.e., approximately $5 \times 10^{20}$ zinc atoms per cubic centimeter, but it is to be observed that the peak occurs substantially at the top surface rather than down in the cell as in the single dosage shot case illustrated in the previous figure. The PN junction is still positioned approximately 0.2 micrometer below the surface as represented by line 57. The N dopant level in the wafer is at line 58, the same level as previously. By comparing FIGS. 4 and 5 it is readily seen that by using multiple shots of progressively larger and larger doses ($10^{14}$ ions/cm$^2$ to $10^{16}$ ions/cm$^2$) with correspondingly lower and lower implant energies (50 kev to 5 kev) in three or four implant steps such that a device is formed having the characteristics as illustrated in FIG. 5, in which substantially no retrograde electric field is present. The desired field substantially reaches the cell top surface, resulting in electron motion toward the junction and thereby greatly reducing the deleterious effects of surface recombination. Also the dopant levels are sufficiently high so as to achieve low sheet resistivity of the implanted region, thereby substantially reducing the series resistance of the device.

While the N+ region 22 at the bottom of the cell can be formed conventionally by a single implant, it is desirable to also form it in the same manner as the just described P+ implanted region and thus optimize its characteristics by multiple dose and energy implants. (Using N dopants instead of P dopants, of course.) The N+ region formed this way will prevent a loss of holes (+ charges) at the bottom metal contact 23.

After the ion implantation of the P impurity at the top of the wafer to create the P+ region and the ion implantation of the N impurity at the bottom of the wafer to create the N+ region, the implanted surfaces must be annealed. It is preferred that they be annealed in separate steps by pulsed electron beams. First the P implant is performed and then pulse annealed, then the N implant is accomplished followed by a pulse anneal. By using the pulsed electron beam the annealing may be done at room temperature. Pulsed electron beam annealing of ion implanted regions to provide an anneal without having to subject the semiconductor material to elevated temperatures is known in the art.

Figure 3:
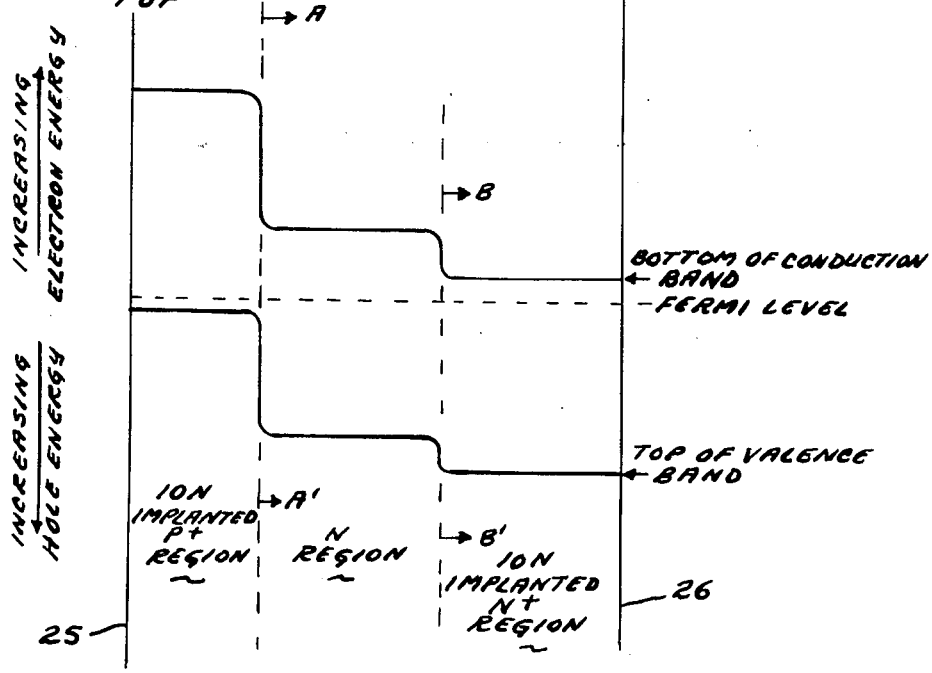
FIG. 3 is a typical band gap diagram of the embodiment schematically illustrated in FIG. 2.

FIG. 3 illustrates a typical band-gap diagram of energy levels in a typical embodiment of the invention. Note that the band-gap diagram in FIG. 3 is representative of typical levels occurring through the wafer along line 24 of FIG. 2, and that the reference lines A—A' and B—B' as well as the cell top 25 and cell bottom 26, correspond. The band-gap diagram illustrated in FIG. 3 is for zero bias.

The cell is completed in a conventional manner by applying conventional metallization contacts 27 and 23 to the top and bottom of the cell. Typical and suitable P side contact materials are tingold, zinc-gold and indium-gold. Typical and suitable N side contact materials are germanium-gold with a nickel overlay. The top contact is generally comprised of a conventional ohmic bus with a conventional grid finger pattern allowing passage of light into the solar cell top surface and allowing collection of charges. The bottom contact covers the entire backside of the solar cell. After metallization and conventionally sintering, a conventional antireflecting coating such as tantalum oxide or silicon oxide is applied to the top of the cell and a conventional cover glass of fused quartz or borosilicate is then applied over the cell top.

I claim:
1. A solar cell comprising:
   a. a wafer formed of a crystal of eutectic gallium arsenide having a plurality of alternating P and N doped regions forming a plurality of vertical PN junctions between a top and a bottom surface thereof;
   b. a P+ region formed by multiple ion implantation into the said top surface of at least three P dopant implantation shots of progressively larger and larger ion doses with correspondingly lower and lower implant energies whereby the location of the maximum dopant density is substantially at the said top surface, and pulsed electron beam annealed;
   c. an N+ region formed by multiple ion implantation into the said bottom surface of at least three N dopant implantation shots of progressively larger and larger ion doses with correspondingly lower and lower implant energies whereby the location of the maximum dopant density is substantially at the said bottom surface, and pulsed electron beam annealed;
   d. a metallization contact positioned on the P+ region formed on said top surface;
   e. a metallization contact positioned on the N+ region formed on said bottom surface.

2. The solar cell as claimed in claim 1 wherein the said P+ and the said N+ regions are formed by multiple ion implantations in steps of increasingly larger and larger doses and lower and lower implant energies over the ranges of approximately $10^{14}$ ions/cm$^2$ to $10^{16}$ ions/cm$^2$ and 50 kev to 5 kev respectively.

3. The method of forming a solar cell on a wafer of eutectic gallium arsenide having a plurality of vertical PN junctions formed between a top surface and a bottom surface there of comprising the steps of:
   a. implanting, using at least three implant steps, a P-type impurity in said top surface by implanting progressively larger and larger implantation doses over the range of approximately $10^{14}$ ions/cm$^2$ to $10^{16}$ ions/cm$^2$ with correspondingly lower and lower energy levels over the range of approximately 50 kev to 5 kev, providing a maximum dopant density of P+ atoms substantially at the said top surface;
   b. implanting, using at least three implant steps, an N-type impurity in said bottom surface by implanting progressively larger and larger implantation doses over the range of approximately $10^{14}$ ions/cm$^2$ to $10^{16}$ ions/cm$^2$ with correspondingly lower and lower energy levels over the range of approximately 50 kev to 5 kev, providing a maximum dopant density of N+ atoms substantially at the said bottom surface;
   c. annealing the said top and bottom surfaces with a pulsed electron beam;
   d. metallizing a contact to the P+ region formed on said top surface; and
   e. metallizing a contact to the N+ region formed on said bottom surface.

* * * * *